United States Patent [19]
Meyer et al.

[11] Patent Number: 5,691,892
[45] Date of Patent: Nov. 25, 1997

[54] RECTIFIER ARRANGEMENT FOR A THREE-PHASE GENERATOR

[75] Inventors: Friedhelm Meyer, Illingen; Richard Spitz; Herbert Goebel, both of Reutlingen; Ulrich Schaefer, Eningen; Vesna Biallas, Reutlingen; Anton Mindl, Tuebingen; Martin Frey, Lichtenstein, all of Germany; Henning Stilke, Llantwit-Major, Great Britain; Holger Haussmann, Metzingen; Siegfried Schuler, Engstingen, both of Germany

[73] Assignee: Robert Bosch GmbH, Stuttgart, Germany

[21] Appl. No.: 385,935

[22] Filed: Feb. 9, 1995

[30]  Foreign Application Priority Data

Feb. 9, 1994 [DE]  Germany ............... 44 03 996.4

[51] Int. Cl.⁶ .................................................. H02M 1/00
[52] U.S. Cl. ............................................ 363/145; 363/141
[58] Field of Search ................................. 363/141, 144, 363/145; 310/68 D

[56]  References Cited

U.S. PATENT DOCUMENTS

| 3,538,362 | 11/1970 | Cheetham ............... 310/68 |
| 4,606,000 | 8/1986 | Steele et al. .............. 363/145 |

FOREIGN PATENT DOCUMENTS

| 0 480 372 | 4/1992 | European Pat. Off. . |
| 2 146 093 | 3/1973 | France . |
| 2 148 458 | 3/1973 | France . |
| 2 229 161 | 12/1974 | France . |
| 2 489 593 | 3/1982 | France . |
| 2 563 379 | 10/1985 | France . |
| 1 452 157 | 10/1976 | United Kingdom . |

Primary Examiner—Peter S. Wong
Assistant Examiner—Rajnikant B. Patel
Attorney, Agent, or Firm—Kenyon & Kenyon

[57]  ABSTRACT

A rectifier arrangement for a three-phase generator having at least one power diode allocated to each half-wave of each phase and a cooling arrangement for the power diodes. The power diodes may be designed as diode chips and be arranged between two diametrically opposed heat sinks, while being oriented with respect to polarity and electrically and/or thermally conductive.

14 Claims, 5 Drawing Sheets

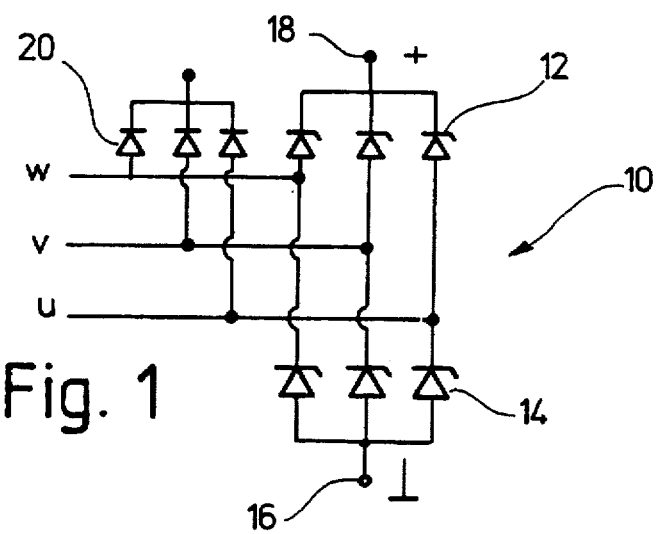
Fig. 1
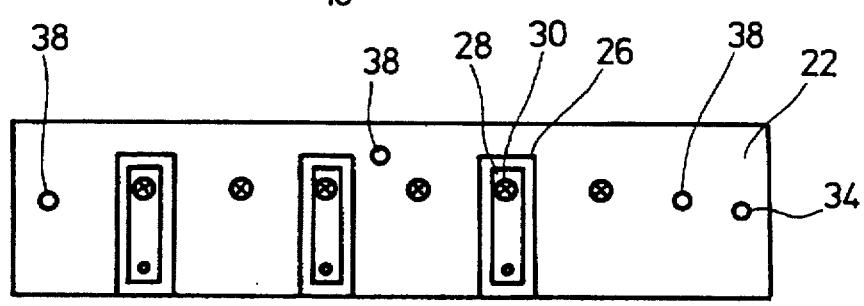
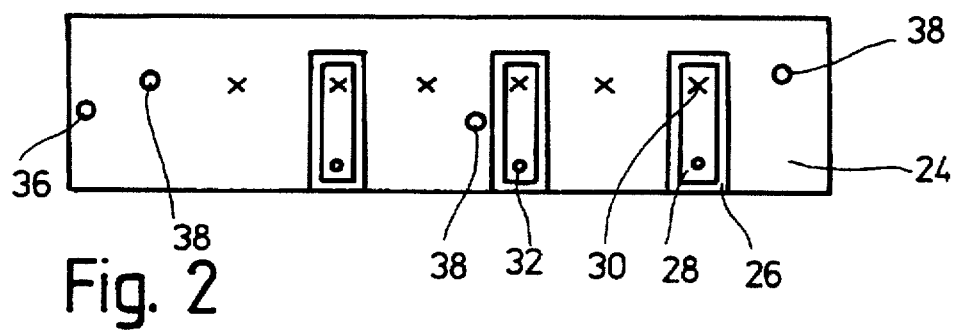
Fig. 2
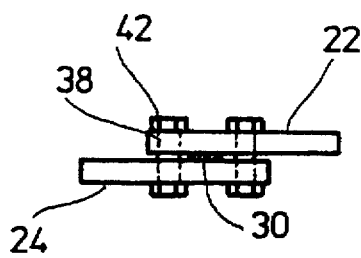
Fig. 3
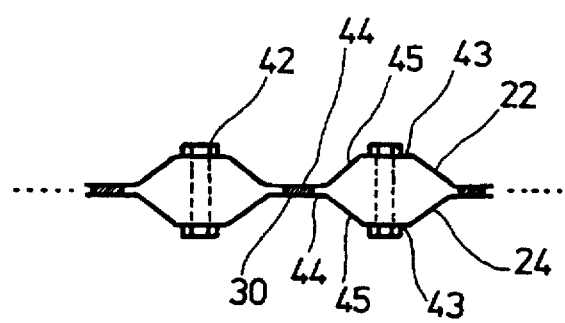
Fig. 4

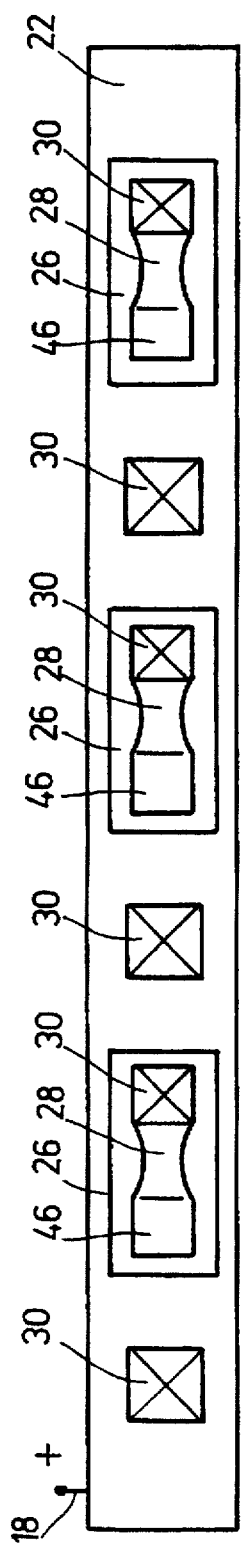
Fig. 5
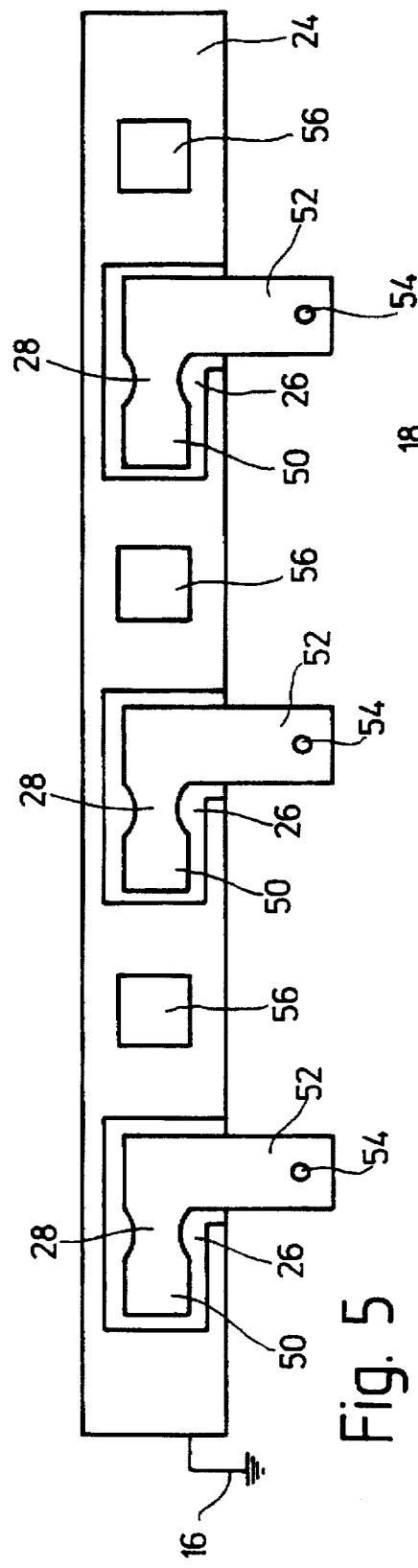
Fig. 6
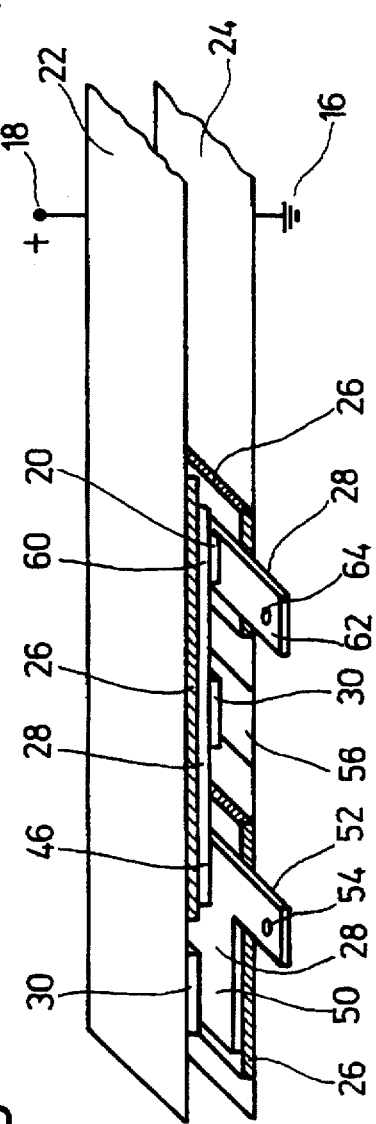

RECTIFIER ARRANGEMENT FOR A THREE-PHASE GENERATOR

FIELD OF THE INVENTION

The present invention relates to a rectifier arrangement for a three-phase generator.

BACKGROUND OF THE INVENTION

Rectifier arrangements for three-phase generators are generally known. When three-phase generators are used for supplying motor vehicle electrical systems, it is necessary for the three-phase alternating current generated in the three-phase generators to be rectified because of the battery charge required in the motor vehicle. For this purpose, semiconductor power diodes are provided, which are interconnected in a three-phase bridge circuit. A power diode is allocated to each half-wave of each phase, so that in the case of a full-wave rectification, the three-phase bridge circuit is comprised of altogether six power diodes. In this case, three positive diodes are connected for the positive side and three negative diodes for the negative side. As is generally known, the power diodes are designed as press-fit diodes, which are pressed into corresponding recesses of the d.c. generator, for example, in an end shield. At the same time, a press-fit base of the press-fit diodes takes on the function of providing a long-lasting thermal and electrical connection for the power diodes. It entails considerable manufacturing expenditure to manufacture such a three-phase bridge circuit comprised of six press-fit diodes.

German Patent Application No. 23 53 373 discloses a semiconductor arrangement, in which the power diodes are distributed among cooling fins that are arranged side-by-side, each of the homopolar power diodes being assigned to one cooling fin. Because of the side-by-side arrangement of two cooling fins, a relatively large space is required for the rectifier arrangement on or in the three-phase generator.

SUMMARY OF THE INVENTION

In contrast, the rectifier arrangement according to the present invention makes it possible to manufacture the rectifier arrangement simply and cost-effectively and to minimize the installation space required for the rectifier arrangement on the three-phase generator. Because the power diodes are designed as diode chips and are arranged between two diametrically opposed heat sinks, while being oriented with respect to polarity, and electrically and/or thermally conductive, it is possible to manufacture a compact, technically simple, easily comprehensible and cost-effective rectifier arrangement as a separate module. The number of power diodes can be easily and simply expanded upon from the basic complement comprising six power diodes for a full-wave rectification to a higher number of power diodes, inclusive of exciter diodes. A good mechanical protection of the power diodes is given simultaneously by arranging the heat sinks to face opposite one another, so that even in the case of unavoidable vibrations, which occur during the operation of a motor vehicle, the rectifier arrangement demonstrates a high level of operational dependability.

BRIEF DESCRIPTION OF THE DRAWINGS

FIG. 1 shows the electric circuit diagram of a three-phase generator.

FIG. 2 shows a top view of a first exemplary embodiment of a rectifier arrangement that is not assembled.

FIG. 3 shows a section through a rectifier arrangement in accordance with FIG. 2.

FIG. 4 shows a schematic side view of a second exemplary embodiment of a rectifier arrangement.

FIG. 5 shows a top view of a third exemplary embodiment of a rectifier arrangement that is not assembled.

FIG. 6 shows a perspective view of a fourth exemplary embodiment of a rectifier arrangement.

DETAILED DESCRIPTION

Figure 7:
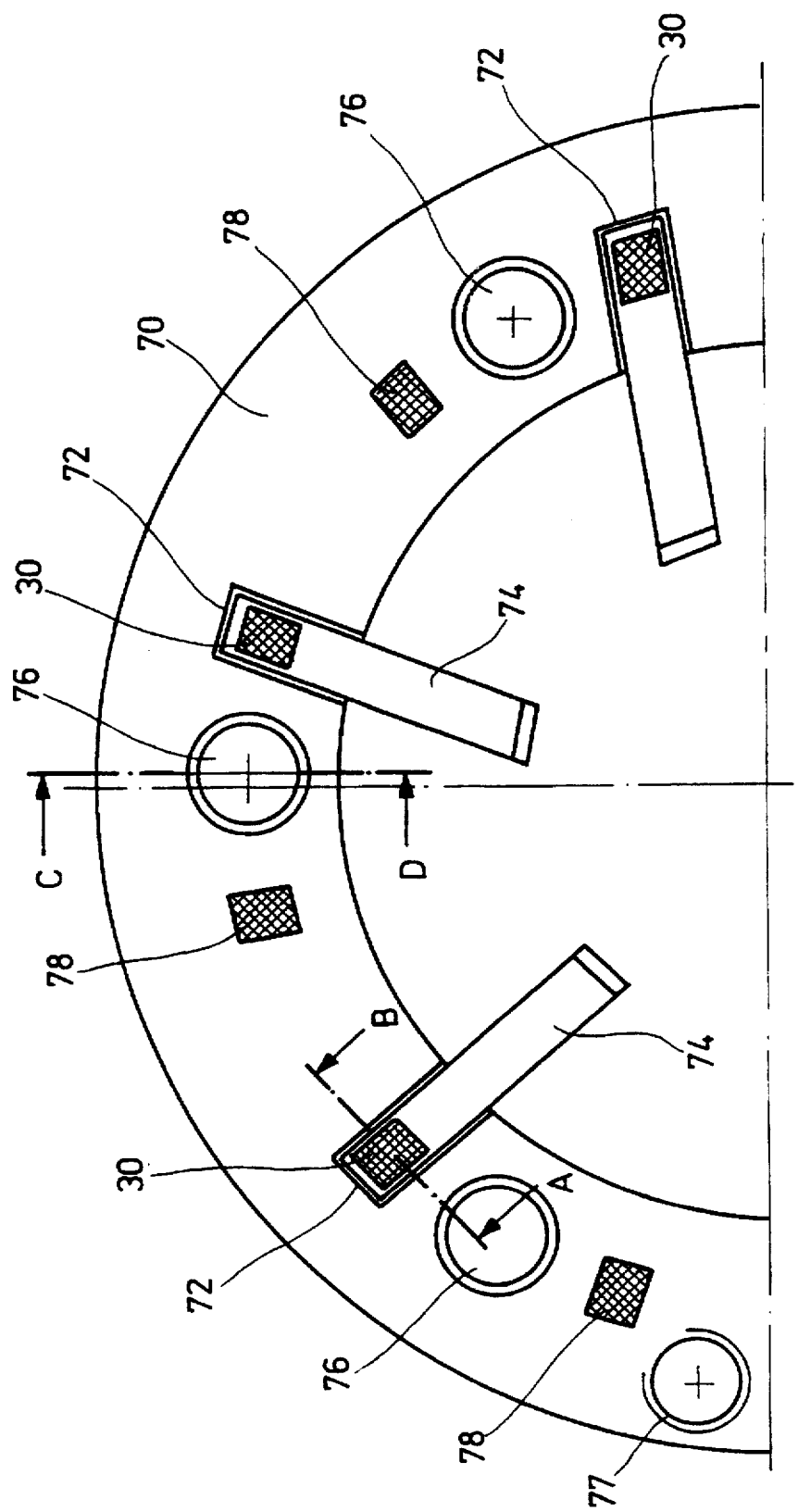
FIG. 7 shows a top view of a heat sink of a rectifier arrangement.

The circuit diagram of a rectifier arrangement for a three-phase generator is shown in FIG. 1. The phases U, V, W of the three-phase generator are connected to a three-phase bridge circuit 10, a positive diode 12 and a negative diode 14 being connected to each phase. The anodes of the negative diodes 14 are connected to a connecting terminal 16, and the cathodes of the positive diodes 12 to a connecting terminal 18. The connecting terminals 16 and 18 are either connected via switches (not shown here) to an electrical consumer or to a motor vehicle battery (likewise not shown). Furthermore, each phase U, V, W is linked to an exciter diode 20, whose interconnected cathodes lead to an exciter winding (not shown) of the three-phase generator. Each of the positive diodes 12 and negative diodes 14 allows a half-wave of the single-phase alternating current to pass through, with whose phase they are connected. The positive diodes 12 allow the positive half-waves and the negative diodes 14 allow the negative half-waves to pass through. The result is the creation of a light-waved d.c. current from the three-phase alternating current of the three-phase generator. During the generator operation, a waste heat is produced in the diodes 12 and 14, which has to be dissipated in an appropriate manner.

A rectifier arrangement in an unassembled state is shown schematically in FIG. 2. The rectifier arrangement has a first heat sink 22 and a second heat sink 24. The heat sinks 22 and 24 are provided in areas with an isolation layer 26. Printed conductors 28 are mounted via soldering on the isolation layers 26. Each of the printed conductors 28 is provided with a diode chip 30. In addition, each of the printed conductors 28 has a connecting terminal 32. The heat sink 22 has a connecting terminal 34 and the heat sink 24 has a connecting terminal 36. In addition, the heat sinks 22 and 24 have through-holes 38.

The manufacturing and the functioning of the rectifier arrangement shown in FIG. 2 will be elucidated in the following. The heat sinks 22 and 24 can consist, for example, of nickelized aluminum, copper, or nickelized copper. The material for the heat sinks 22 and 24 is selected in accordance with the bonding or soldering technique to be clarified later on. The isolation layers 26 can be produced by a local galvanic anodization of the heat sinks 22 and 24. It is also possible for aluminum oxide $Al_2O_3$ to be applied, for example, by means of thermal spray-coating, such as flamespraying, plasma spraying or the like. Another possibility is for the isolation layers 26 to be made up of ceramic plates that are welded or soldered on to the heat sinks 22 and 24 at prescribed locations. The printed conductors 28 are then applied to the isolation layers 26, for example, by means of thermal spray-coating. In another variant, the metal film that produces the printed conductors 28 can be applied to the isolation layers 26 by means of sputter or vapor deposition. The cross-section of the metal layer of the printed conductors 28 must be ample enough to allow the later generator current to flow across it. The printed conductors 28 have a surface area that is capable of being soldered, at least in the region where the diode chips 30 are applied.

The through-holes 38 serve to position the heat sinks 22 and 24 on corresponding part carriers. The part carriers can have guide pins to reach through the through-holes 38. Solder disks are applied to the positions on the printed conductors 28 provided for the diode chips 30 and to the intermediate positions, for example, on the heat sink 22. One diode chip 30 is placed on each of the solder disks, so that, in this example, altogether six diode chips 30 having the same orientation, i.e., having a p-n junction pointing in the same direction, are situated on the heat sink 22. The diode chips 30 can be simply removed from a diode wafer, which contains the already separated diode chips 30. Another solder disk is applied to the diode chips 30.

At this point, the heat sink 24 is positioned on the heat sink 22 so as to allow the sides provided with the printed conductors 28 to face one another. The pins of the part carrier that are guided through the through-holes 28 can be used to ensure exact positioning.

The module created from the heat sinks 22 and 24 is only loaded by the specific weight of the upper heat sink 24. Thus, a relatively small application pressure for the diode chips 30 is given during the soldering process. The module is subsequently brazed (hard-soldered), for example, in a vacuum inert-gas-shielded soldering oven. The brazed module can then be removed from the part carrier and be screw-coupled through the then freed through-holes 38 by means of insulated screws, for example, of plastic. The screw coupling of the heat sinks 22 and 24 must be synchronized so as to exert a force on each diode chip 30 that is substantial enough for the later operation to be applied. This can be adjusted by prescribing a torque for the screw-coupling. The force exerted on the diode chips 30 can, for example, assume values of greater than 3N. In a last work step, the diode chips 30 are passivated, and/or the resultant space between the heat sinks 22 and 24 is compounded with an insulating material. The finished module is now electrically calibrated, i.e., the thermal resistance, the reverse blocking current, the forward voltage, and the breakdown voltage at high currents are determined for each diode chip 30.

The module clarified on the basis of FIG. 2, i.e., the rectifier arrangement, constitutes the three-phase bridge circuit 10 shown in FIG. 1, except for the exciter diodes. The phases U, V, W of the three-phase generator are connected via the connecting terminals 32, each of the phases always being connected to two oppositely oriented diode chips 30, advantageously to two adjacent diode chips 30. The connecting terminal 34 of the heat sink 22 then constitutes the connecting terminal 18, and the connecting terminal 36 of the heat sink 24 constitutes the connecting terminal 16 of FIG. 1.

A simple realization of a compact rectifier, which takes up little space and is, therefore, very suitable for installation in three-phase generators in motor vehicles, is rendered possible by the arrangement shown in FIG. 2. The arrangement of FIG. 2 serves merely to clarify the design and assembly principle of such a rectifier. It is also possible for the heat sinks 22 and 24 to have a curvilinear shape to facilitate adaptation to three-phase generators. In addition, it is possible for the exciter diodes 20 shown in FIG. 1 to be integrated in the rectifier module.

FIG. 3 depicts a side view of the rectifier arrangement clarified in FIG. 2 in an assembled state. The heat sink 22 and the heat sink 24 are coupled to one another via screw connections 42, which extend through the through-holes 38. The through-holes 38 are offset from one another so as to allow the diode chips 30, when viewed from the side, to be situated between the screw connections 42. Thus, it is possible for force to be distributed uniformly over the diode chips 30. In addition, it is clear that the heat sinks 22 and 24 are offset from one another. This makes the printed conductors 28 with their connecting terminals 32 easily accessible from the outside, so that the generator phases U, V, W can be connected up without difficulty. Furthermore, the asymmetrical arrangement of the heat sinks 22 and 24 makes it possible for a cool air current from a fan impeller to be applied to both heat sinks directly. Thus, a uniform and effective cooling of both heat sinks 22 and 24 is given. The rectifier arrangement shown in FIGS. 2 and 3 can be attached to a three-phase generator simply by means of a screw connection on an end shield of the three-phase generator.

FIG. 4 depicts another variant of the refinement of the heat sinks 22 and 24. The arrangement is shown here only in a cutaway view to clarify the principle. The diode chips 30 are mounted and arranged analogously to the variant shown in FIGS. 2 and 3. In cross-section, the heat sinks show a profiled shape. The profiling is formed so as to provide the heat sinks 22 and 24 with lower and higher flat regions 43 and 44 respectively, which run nearly parallel to one another and are interconnected via limbs 45. The higher flat regions 44 are arranged on different levels, so that the result is an undulatory structure for the heat sinks 22 and 24. During assembly, i.e., in the case of adjacent heat sinks 22 and 24 as shown in FIG. 2, the insulating layers 26, the printed conductors 28, and the diode chips 30 are mounted on the higher flat regions 44. The lower flat regions 43 have the through-holes 38. After the heat sinks 22 and 24 are mounted, the higher flat regions 44 come to rest against one another, so that the diode chips 30 located here demonstrate the desired electrical contact with the heat sinks 22 or 24. The insulated screw connections 42 are guided through the through-holes 38 in the lower flat regions 43 that are now spaced apart by the undulated structure of the heat sinks 22 and 24. In the case of a controlled screw coupling, a spring energy is exerted via the limbs 45 connecting the lower flat regions 43 on the higher flat regions 44 accommodating the diode chips 30, for example, by prescribing the torque for the screw connections 42. It is thus possible to realize a reliable compressive contact on the diode chips 30, which at all times guarantees a large enough compressive force on the diode chips 30, even in the case of the unavoidable vibrations in a motor vehicle.

FIG. 5 illustrates a rectifier arrangement similar to the one shown in FIG. 2. Parts having the same function as those in FIG. 2 are given the same reference symbols, although they having a different form here. The heat sink 22 shown here on top has local regions, which are provided with an isolation layer 26. The printed conductors 28, which on the one end have a contact region 46 and, on the other end, have the diode chip 30, are mounted on the isolation layers 26. In addition, diode chips 30 are arranged directly, i.e., electroconductively, on the heat sink 22. The heat sink 24 likewise has regions in which an isolation layer 26 is applied. The isolation layers 26 here also support printed conductors 28, which have a contact region 50, and a contact region 52 that leads to the outside of the heat sink 24. Connecting terminals 54 are provided on the contact regions 52. Furthermore, single contact regions 56, which are isolated from the printed conductors 28, are arranged on the heat sink 24. The contact regions 56 are electroconductively connected to the heat sink 24. The heat sink 22 has the connecting terminal 18, and the heat sink 24 has the connecting terminal 16 (compare to FIG. 1).

The isolation layers 26 of the printed conductors 28 can be applied in the manner just clarified for FIG. 2. The diode chips 30 are all mounted with the same orientation via solder disks on the positions designated on the heat sink 22. In contrast to FIG. 2, the diode chips 30 here have already been brazed before the final assembly of the two heat sinks 22 and 24. This advantageously allows a plasma de-smearing of the diode chips 30 following the brazing of the diode chips 30 and prior to the mounting of the heat sink 24. The heat sink 24 is screwed on to the heat sink 22 so as to allow the contact regions 50 to come to rest on the diode chips 30, which are electroconductively connected to the heat sink 22. The contact regions 56 come to rest on the diode chips 30, which are mounted over an isolation layer 26 on the heat sink 22. Furthermore, the contact regions 52 come to rest directly on the contact regions 46. By means of insulated screw connections (not shown here), the heat sinks 22 and 24 are screwed together in a controlled manner, so as to produce a predetermined, ample force for contacting the diode chips 30. Overall, therefore, a simple, compact rectifier arrangement with three positive diodes 12 and three negative diodes 14 (compare to FIG. 1) is created, in spite of the fact that the diode chips 30 are mounted with the same orientation on the heat sink 22.

The generator phases U, V, and W can be connected up simply by way of the brought-out contact regions 52. Here, the advantage presents itself that with one single connection for the generator phases, the electrical connection to the positive diodes and the negative diodes is established simultaneously. By way of the contact regions 52 and 46, the diode chips 30 that are mounted as insulated chips on the heat sink 22 are connected up electrically, while the diode chips 30 that are not arranged as insulated chips on the heat sink 22 are electrically connected via the contact region 50. The heat sinks 22 and 24, which are able to be connected to the motor vehicle battery or to the consumers loads, can be simply provided with the connecting terminals 18 and 16, for example by means of a bore.

In a cutaway view, FIG. 6 depicts an arrangement, which is constructed in accordance with the same principle as elucidated for FIG. 5, in which are additionally integrated, however, the exciter diodes denoted by 20 in FIG. 1. The parts that are the same in terms of function as those in FIGS. 2 and 5 are again provided with the same reference symbols, although the design is somewhat different here. The heat sinks 22 and 24 are screwed to one another in the direction of the arrow, but are illustrated here somewhat set apart for the sake of clarity. The isolation layers 26 provided on the heat sink 22 and the printed conductors 28 are lengthened here, so that an additional contact region 60 results. Another isolation layer 26 is provided opposite the contact region 60 on the heat sink 24, and it has a printed conductor 28 with a contact region 62 that is brought to the outside. The contact region 62 has a connecting terminal 64. Another diode chip 20, which in the final assembly state of the heat sinks 22 and 24 is connected to the contact region 62, is provided on the contact region 60. Overall therefore, it is achieved here that one generator phase U, V, W can be connected up in each case via one connecting terminal 54, and the positive diodes 12, negative diodes 14, and exciter diodes 20 assigned to the phase (compare to FIG. 1) are connected at the same time. An exciter winding of the three-phase generator can be connected via the connecting terminal 64 to the contact region 62 that is brought out as an insulated region.

Figure 8:
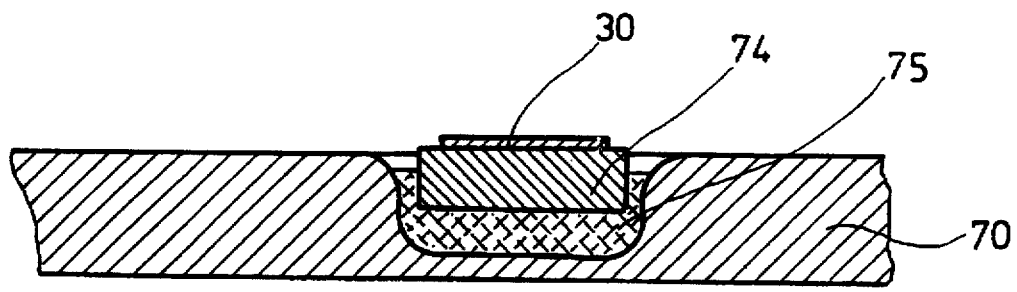
FIG. 8 shows a longitudinal section along the line A–B of FIG. 7.
Figure 9:
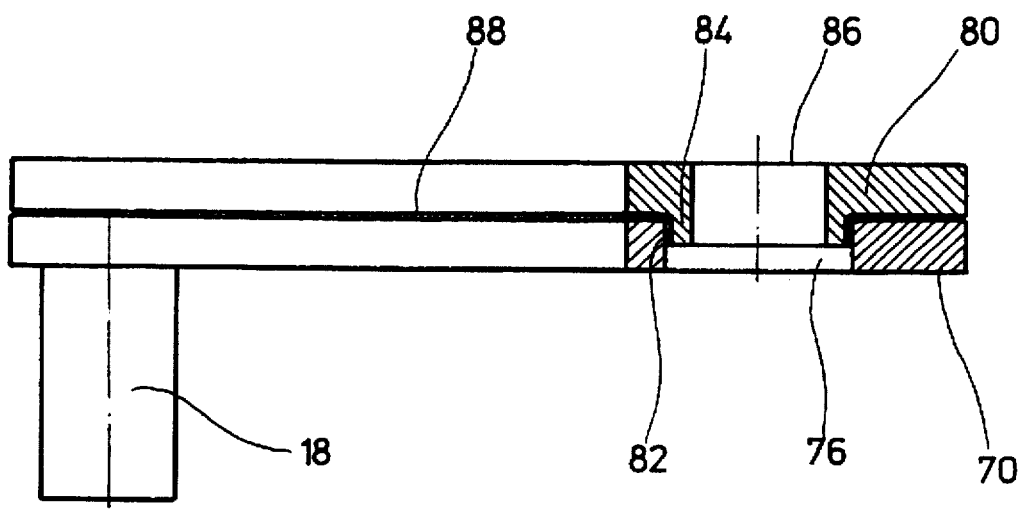
FIG. 9 shows a longitudinal section along the line C–D of FIG. 7.

A concrete refinement of the principle clarified in FIGS. 1 through 6 is illustrated in FIGS. 7 through 9. FIG. 7 shows the top view of a cooling body 70 (heat sink 22). The cooling body has an arched shape and is adapted to the geometric dimensions of a three-phase generator. The cooling body 70 has recesses 72, which run radially and in which current bars 74 are arranged. The current bars 74 are brought out of the cooling body 70, radially to the inside, and carry the diode chips 30 on their areas situated inside the cooling body 70. The current bars 74 are cemented in place, as clarified by FIG. 8, in the recesses 72 by means of a sealing compound 75. In addition to mechanically fixing the current bars 74 in place, the sealing compound 75 assumes the function of insulating the current bars 74 from the cooling bodies 70. In addition, the cooling bodies 70 have through-holes 76, as well as 77. The contact regions, which are electroconductively connected to the diode chips 30 of the second cooling body (not shown here) are designated by 78 on the cooling body 70.

The diode chips 30 are soldered by means of solder disks to the current bars 74. The cooling body 80 (heat sink 24), which constitutes the mating component for the cooling body 70, is subsequently screwed to the cooling body 70. In so doing, insulating screw connections can be established through the through-holes 77. The diode chips 30 depicted in FIG. 7 make direct contact with the mounted cooling body, while the diode chips 30 arranged analogously in the applied cooling body over current bars come to rest on the points of contact of the cooling body 70 denoted here by 78. Overall, therefore, an arrangement is created wherein the diode chips 30 are arranged between two cooling bodies and are directly contacted in turn by the cooling body 70 or the mounted cooling body 80. Thus, each of the cooling bodies can be provided with a connecting terminal 18 or 16, which lead to the motor vehicle battery or to the consumers loads. The phases of the three-phase generator are connected to the current bars 74.

A composite construction consisting of the cooling body 70 and the second cooling body 80 is shown in FIG. 9. On the basis of this view, it becomes clear that the cooling body 70 has an indentation 82, with which a collar 84 of the cooling body 80 mates with a precise fit. The cooling body 80 has a through-hole 86 that is aligned with the through-hole 76. The collar 84 that mates with the indentation 82 permits a self-alignment of the cooling bodies 70 and 80 already before the two cooling bodies 70 and 80 are screw-coupled, so that the diode chips 30 come to rest precisely at their predetermined positions. It is important that the positions of the diode chips 30 be observed to ensure that one diode chip 30 will only come in electrical contact with one cooling body 70 or 80. Before the cooling bodies 70 and 80 are joined, a sealing compound 88 is introduced between them so as to insulate the cooling bodies 70 and 80 from one another. The strength of the sealing compound 88 is variable in this case and can be adapted to the structural conditions.

Figure 10:
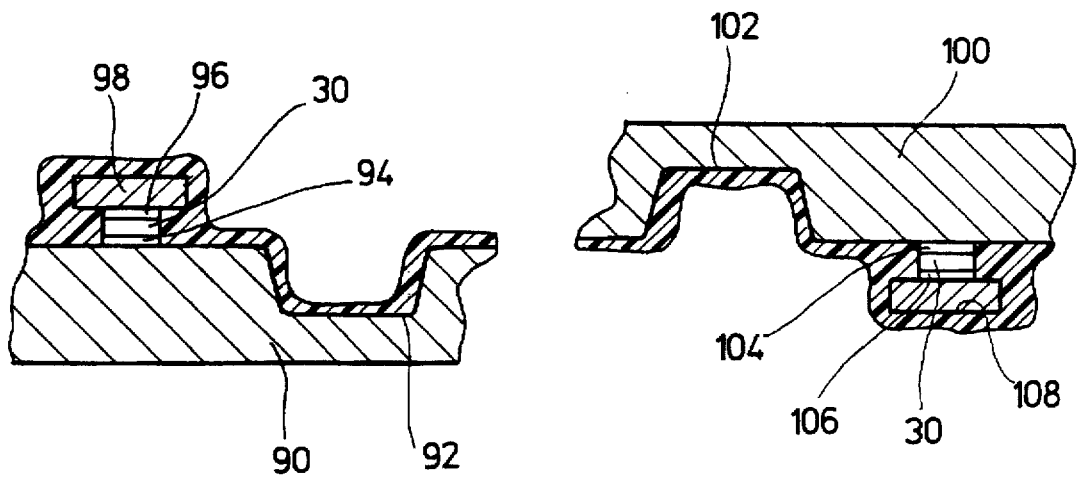
FIG. 10 shows a cross-section of a fifth exemplary embodiment of a rectifier arrangement, not in an assembled state.
Figure 11:
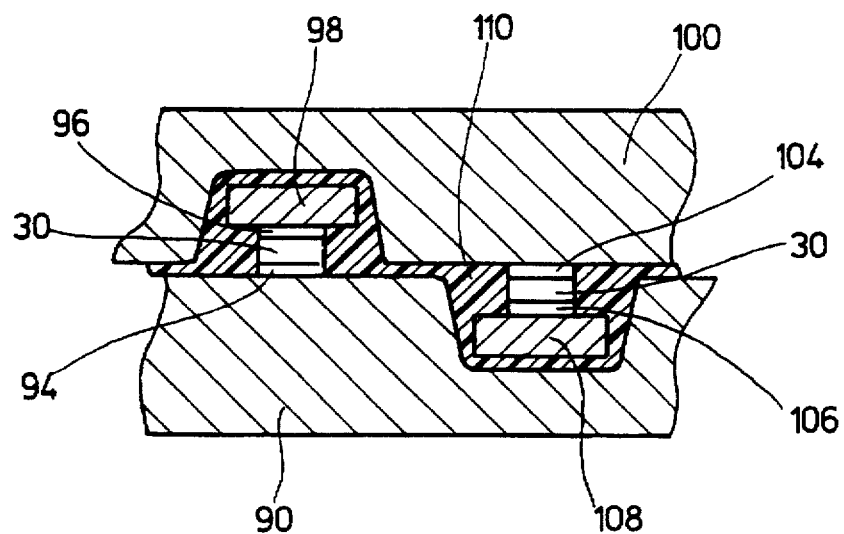
FIG. 11 shows the rectifier arrangement according to FIG. 10 in the assembled state.

FIGS. 10 and 11 show another variant of an embodiment of a rectifier arrangement. FIG. 10 depicts an unassembled, and FIG. 11 a final assembled state. A first cooling body 90 (heat sink 22) has an indentation 92. A diode chip 30 is arranged on a surface-area region of the cooling body 90 situated next to the indentation 92. The diode chip is brazed on the one hand via a solder disk 94 to the cooling body 90 and via a solder disk 96 to a current bar 98. During the brazing operation, spacers that are not visible in FIG. 10 are arranged between the current bar 98 and the cooling body 90 and guarantee a pressure relief for the diode chip 30. The configuration according to FIG. 10 is shown in a cross-section, which corresponds to the view along the line A–B of FIG. 7. However, the view is not restricted to the representation of the one area of a diode chip 30.

A second cooling body 100 (heat sink 24) is constructed as a mirror image of the cooling body 100. It likewise has a recess 102 and a composite construction consisting of a diode chip 30 and a current bar 108 that is soldered on to the cooling body 100 via solder disks 104, 106. In accordance with the overview shown in FIG. 11, it becomes clear that the composite construction consisting of the current bar 98 and the diode chip 30 arranged on the cooling body 90 mates with the recess 102 of the cooling body 100. The composite construction consisting of the current bar 108 and the diode chip 30 arranged on the cooling body 100 mates with the recess 92 of the cooling body 90. A remaining space between the cooling bodies 90 and 100 is filled with a sealing compound 110, for example an adhesive agent. The sealing compound 110 has a property which guarantees an electrical insulation of the current bars 98 and 108 from the cooling bodies 90 and 100 and between the cooling bodies 90 and 100.

Because the current bars 98, 108 and diode chips 30 are surrounded in the final assembled state, as a result of their being introduced into the indentations 92 and 102, over a large surface by the cooling bodies 90 or 100, besides the advantage of a rugged arrangement that is insensitive to mechanical stresses, the advantage is also attained of a very favorable heat dissipation across the cooling bodies 90 and 100. The cooling bodies 90 and 100 are screw-coupled to one another analogously to the examples already described. The electrical contact between the diode chips 30 and the cooling body 90 or 100 and the current bars 98 or 108 is established here as the result of brazing. The current bars 98 and 108 are again brought radially out of the cooling bodies 90 or 100, as shown in FIG. 7, and have suitable connecting terminals to enable connection to one of the generator phases U, V, W. Overall, therefore, the rectifier arrangement has at least three of the arrangements of the diode chips 30 shown in cutaway views in FIGS. 10 and 11, namely one arrangement for each generator phase U, V, W. The rectifier arrangement can be expanded at any time to include several diode chips, for example for additional diodes and/or for exciter diodes.

The variants of embodiments shown in FIGS. 1 through 11 make it possible for a three-phase bridge circuit to be developed in the narrowest of spaces to rectify a three-phase alternating current of a three-phase generator. In spite of this compact type of construction, an excellent electrical contacting of the diode chip is achieved by means of flat contacts. Furthermore, the configuration of the diametrically opposing heat sinks 22 and 24 assures that there is adequate dissipation of heat and guarantees an electrical isolation between the heat sinks and 24.

What is claimed is:

1. A rectifier arrangement for a three-phase generator comprising:
    at least one conductive power diode allocated to each half-wave of each phase of the three-phase generator, the power diodes being contained on diode chips, the diode chips having a preselected polar orientation; and
    a cooling arrangement including a first heat sink and a second heat sink, the first and second heat sinks being diametrically opposed, diode chips being arranged between the first heat sink and the second heat sink;
    wherein the diode chips are at least one of electrically and thermally conductive, wherein diode chips arranged on a surface of the first heat sink have the same orientation and are arranged directly opposite and electrically isolated from the second heat sink, and wherein, along a preselected axis perpendicular to the surface of the first heat sink, only one of the diode chips is arranged.

2. The rectifier arrangement according to claim 1, wherein each of the diode chips has a first side and a second side, and the second heat sink has arranged thereon an isolation layer on which is arranged at least one printed conductor, each of the diode chips having the same orientation with respect to a p-n junction being arranged with the first side directly on the first heat sink and with the second side on the second heat sink on the printed conductor.

3. The rectifier arrangement according to claim 2, wherein the printed conductor is adapted to be connected to a respective phase of the three-phase generator.

4. The rectifier arrangement according to claim 1, wherein each heat sink has a shared potential-connecting terminal.

5. The rectifier arrangement according to claim 2, wherein the heat sinks are coupled via at least one insulated screw connection.

6. The rectifier arrangement according to claim 1, wherein the heat sinks are arranged offset from one another.

7. The rectifier arrangement according to claim 1, wherein the heat sinks have regions which lie at different height levels.

8. The rectifier arrangement according to claim 7, wherein the diode chips are arranged between diametrically opposed regions, and screw connections are arranged between the diametrically opposed regions.

9. The rectifier arrangement according to claim 5, wherein each of the diode chips is mounted on one of the heat sinks and the printed conductor via a soldered connection.

10. The rectifier arrangement according to claim 9, wherein each of the diode chips is brought into contact with one of the heat sinks and the printed conductor by a force applied to the screw connection.

11. The rectifier arrangement according to claim 2, wherein the heat sinks have recesses in which the printed conductor and the diode chips are arranged.

12. The rectifier arrangement according to claim 11, wherein the diode chips extend over a surface of the heat sinks.

13. The rectifier arrangement according to claim 2, wherein the heat sinks have indentations for mating the printed conductor and the diode chips of the diametrically opposed heat sinks.

14. The rectifier arrangement according to claim 1, further comprising a sealing compound between the first heat sink and the second heat sink.

* * * * *

UNITED STATES PATENT AND TRADEMARK OFFICE
CERTIFICATE OF CORRECTION

PATENT No. : 5,691,892

DATED : November 25, 1997

INVENTOR(S): Meyer et al.

It is certified that error appears in the above-identified patent and that said Letters Patent is hereby corrected as shown below:

Column 7, line 64, "sinks and" should be --sinks 22 and--.

Signed and Sealed this

Twenty-fifth Day of August, 1998

Attest:

BRUCE LEHMAN

Attesting Officer

Commissioner of Patents and Trademarks